(12) United States Patent
Kim et al.

(10) Patent No.: US 9,123,663 B2
(45) Date of Patent: Sep. 1, 2015

(54) SEMICONDUCTOR DEVICE AND METHOD OF FORMING SHIELDING LAYER GROUNDED THROUGH METAL PILLARS FORMED IN PERIPHERAL REGION OF THE SEMICONDUCTOR

(75) Inventors: OhHan Kim, Kyunggi-Do (KR); SeungWon Kim, Kyunggi-Do (KR); JoungUn Park, Kyunggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 1899 days.

(21) Appl. No.: 12/136,682

(22) Filed: Jun. 10, 2008

(65) Prior Publication Data
US 2009/0302436 A1 Dec. 10, 2009

(51) Int. Cl.
| | | |
|---|---|---|
| H01L 21/00 | (2006.01) | |
| H01L 23/31 | (2006.01) | |
| H01L 21/56 | (2006.01) | |
| H01L 23/29 | (2006.01) | |
| H01L 23/552 | (2006.01) | |
| H01L 23/00 | (2006.01) | |

(52) U.S. Cl.
CPC .......... *H01L 23/3121* (2013.01); *H01L 21/561* (2013.01); *H01L 23/29* (2013.01); *H01L 23/3128* (2013.01); *H01L 23/552* (2013.01); *H01L 24/97* (2013.01); *H01L 24/48* (2013.01); *H01L 2224/16225* (2013.01); *H01L 2224/48091* (2013.01); *H01L 2224/97* (2013.01); *H01L 2924/0103* (2013.01); *H01L 2924/01004* (2013.01); *H01L 2924/01006* (2013.01); *H01L 2924/01013* (2013.01); *H01L 2924/01029* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/14* (2013.01); *H01L 2924/1433* (2013.01); *H01L 2924/15311* (2013.01); *H01L 2924/19041* (2013.01); *H01L 2924/3011* (2013.01); *H01L 2924/3025* (2013.01); *H01L 2924/30105* (2013.01)

(58) Field of Classification Search
CPC ............ H01L 2924/01079; H01L 2924/01078
USPC ........... 438/106, 121; 257/E23.033, E23.052, 257/E23.092, E21.495
See application file for complete search history.

(56) References Cited

U.S. PATENT DOCUMENTS

| | | | | |
|---|---|---|---|---|
| 5,838,551 | A | * | 11/1998 | Chan .............................. 361/818 |
| 6,534,859 | B1 | * | 3/2003 | Shim et al. .................... 257/706 |

(Continued)

*Primary Examiner* — Thao X Le
*Assistant Examiner* — Eric Jones
(74) *Attorney, Agent, or Firm* — Robert D. Atkins; Patent Law Group: Atkins and Associates, P.C.

(57) ABSTRACT

A shielded semiconductor device is made by mounting semiconductor die to a first substrate. An encapsulant is formed over the semiconductor die and first substrate. A dicing channel is formed through the encapsulant between the semiconductor die. A hole is drilled in the first substrate along the dicing channel on each side of the semiconductor die. A shielding layer is formed over the encapsulant and semiconductor die. The hole is lined with the shielding layer. The first substrate is singulated to separate the semiconductor die. The first substrate is mounted to a second substrate. A metal pillar is formed in the opening to electrically connect the shielding layer to a ground plane in the second substrate. The metal pillar includes a hook for a mechanically secure connection to the shielding layer. An interconnect structure is formed on the first substrate to electrically connect the semiconductor die to the second substrate.

24 Claims, 10 Drawing Sheets

(56) References Cited

U.S. PATENT DOCUMENTS

| | | |
|---|---|---|
| 6,881,896 B2 * | 4/2005 | Ebihara .................. 174/546 |
| 6,947,295 B2 * | 9/2005 | Hsieh ..................... 361/818 |
| 7,145,084 B1 | 12/2006 | Sarihan et al. |
| 7,187,060 B2 | 3/2007 | Usui |
| 7,687,895 B2 * | 3/2010 | Brunnbauer et al. ......... 257/685 |
| 2002/0015291 A1 * | 2/2002 | Kohjiro et al. ................ 361/760 |
| 2004/0180525 A1 * | 9/2004 | Shim et al. .................... 438/612 |
| 2005/0067676 A1 * | 3/2005 | Mahadevan et al. .......... 257/659 |
| 2006/0145361 A1 * | 7/2006 | Yang et al. .................... 257/787 |
| 2007/0145539 A1 | 6/2007 | Lam |
| 2008/0265421 A1 * | 10/2008 | Brunnbauer et al. ......... 257/758 |
| 2009/0294928 A1 | 12/2009 | Kim et al. |

* cited by examiner

SEMICONDUCTOR DEVICE AND METHOD OF FORMING SHIELDING LAYER GROUNDED THROUGH METAL PILLARS FORMED IN PERIPHERAL REGION OF THE SEMICONDUCTOR

FIELD OF THE INVENTION

The present invention relates in general to semiconductor devices and, more particularly, to a semiconductor device having metal pillars formed through a substrate in a peripheral region around the semiconductor die to interconnect a top shielding layer with a ground plane.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired electromagnetic interference (EMI) and radio frequency interference (RFI), or other inter-device interference, such as capacitive, inductive, or conductive coupling, also known as cross-talk, which can interfere with the operation of adjacent circuit elements.

To isolate the semiconductor devices from EMI and RFI, a shielding layer is typically disposed over the semiconductor device and connected to a ground plane and other conductive elements disposed in the substrate, such as taught by U.S. Pat. No. 7,187,060 and US patent publications 20060145361 and 20070145539. The ground plane usually requires a thinner substrate which increases risk of breakage. In addition, the shielding layer may require a plating process, which involves additional production steps and add costs to the manufacturing process.

SUMMARY OF THE INVENTION

A need exists for a shielded semiconductor package with a simple interconnect between a top shielding layer and ground point. Accordingly, in one embodiment, the present invention is a method of making a shielded semiconductor device comprising the steps of providing a first substrate, mounting a plurality of semiconductor die to the first substrate, forming an encapsulant over the semiconductor die and first substrate, forming a dicing channel through the encapsulant between the semiconductor die, forming an opening in the first substrate along the dicing channel, forming a shielding layer over the encapsulant, lining the opening with the shielding layer, singulating the first substrate to separate the semiconductor die, mounting the first substrate to a second substrate, and forming a metal pillar in the opening to electrically connect the shielding layer to a ground plane in the second substrate.

In another embodiment, the present invention is a method of making a semiconductor device comprising the steps of providing a first substrate, mounting a semiconductor die to the first substrate, forming an encapsulant over the semiconductor die and first substrate, forming a dicing channel through the encapsulant in a peripheral region around the semiconductor die, forming an opening in the first substrate along the dicing channel, forming a shielding layer over the encapsulant, lining the opening with the shielding layer, mounting the first substrate to a second substrate, and forming a metal pillar in the opening to electrically connect the shielding layer to a ground plane in the second substrate.

In another embodiment, the present invention is a method of making a semiconductor device comprising the steps of providing a substrate, mounting a semiconductor die to the substrate, forming an encapsulant over the semiconductor die and substrate, forming a shielding layer over the encapsulant, and forming a metal pillar through the shielding layer and substrate in a peripheral region around the semiconductor die to electrically connect the shielding layer to a ground point.

In another embodiment, the present invention is a semiconductor device comprising a substrate and a semiconductor die mounted to the substrate. An encapsulant is formed over the semiconductor die and substrate. A shielding layer is formed over the encapsulant. A metal pillar is formed through the shielding layer and substrate in a peripheral region around the semiconductor die to electrically connect the shielding layer to a ground point.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
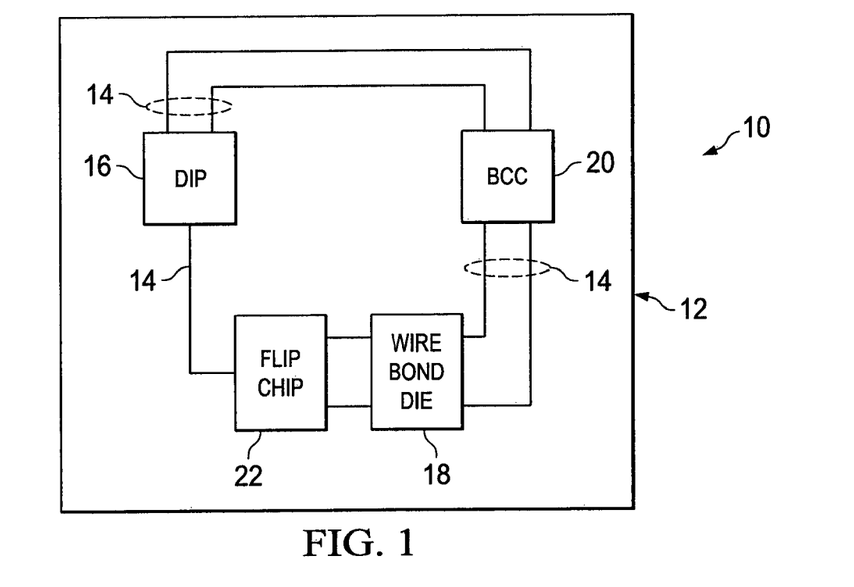
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
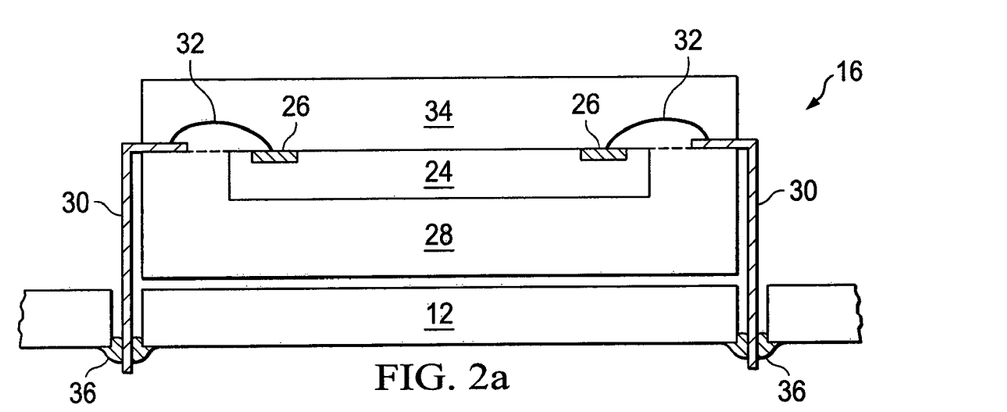
FIGS. 2a-2d illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
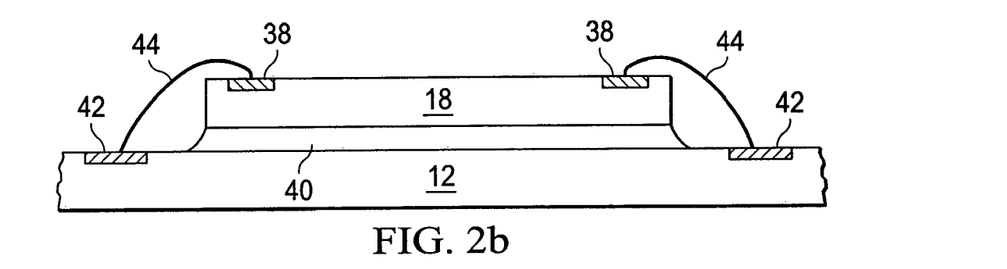

Referring to FIG. 2b, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
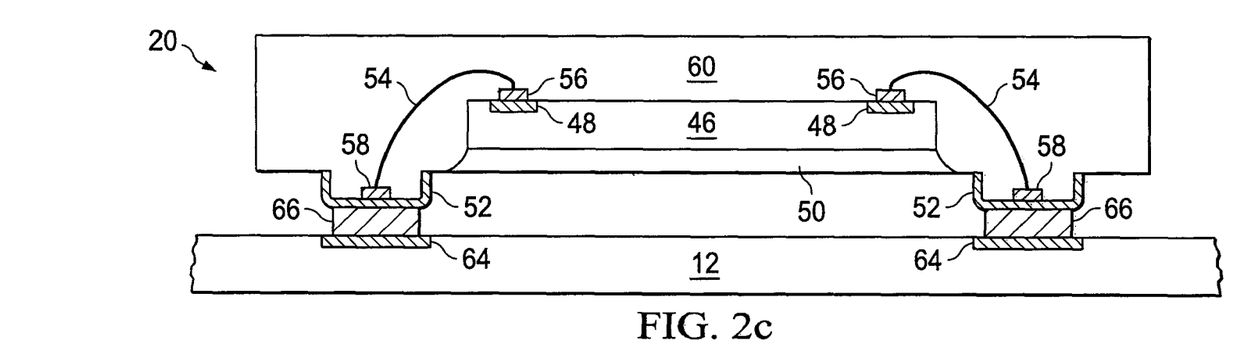

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
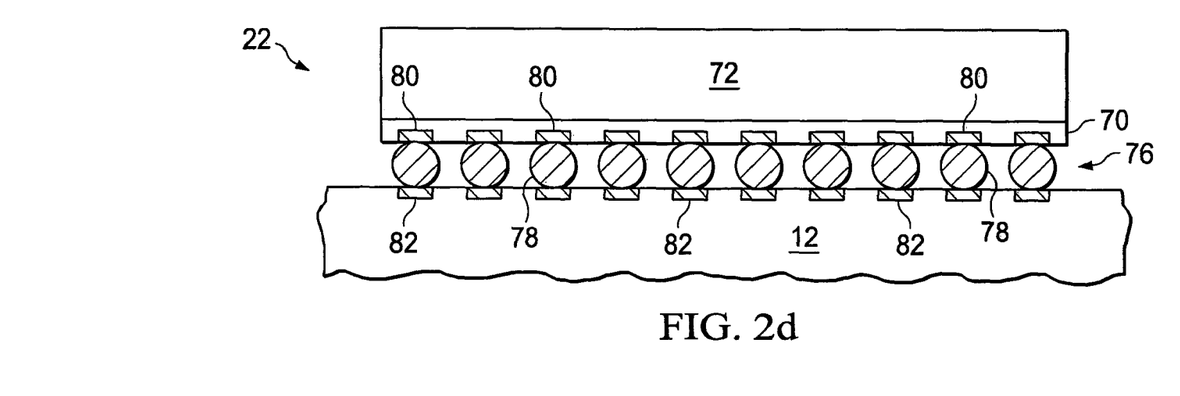

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
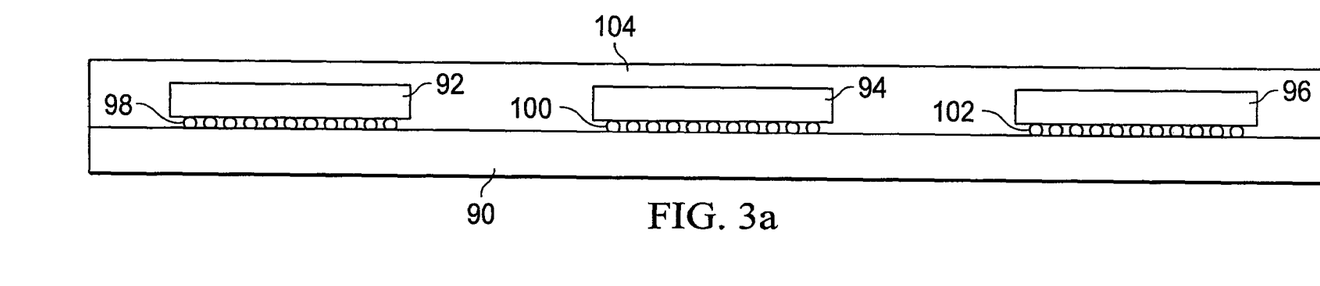
FIGS. 3a-3d illustrate a process of forming a top shielding layer over encapsulant enclosing semiconductor die.

FIGS. 3a-3d illustrate a process of enclosing a semiconductor die with electromagnetic interference (EMI) or radio frequency interference (RFI) shielding. In FIG. 3a, a multilayer laminate substrate 90 provides structural support and electrical interconnect for semiconductor die 92, 94, and 96. Each semiconductor die has an active area containing analog or digital circuits implemented as active devices, passive devices, conductive layers, and dielectric layers electrically interconnected according to the electrical design of the die. Substrate 90 can have multiple layers of silicon, silicon carbide, polymer, polymer composite, metal, ceramic, glass, glass epoxy, beryllium oxide, or other rigid material.

An electrically conductive solder material is deposited over contact pads in semiconductor die 92-96 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 98, 100, and 102. In some applications, solder bumps 98-102 are reflowed a second time to improve electrical connection to the contact pads of the semiconductor die. Solder bumps 98 bond to the contact pads on substrate 90 to provide an electrical interconnect between semiconductor die 92 and an interconnect structure in the substrate. Likewise, solder bumps 100 bond to the contact pads on substrate 90 to provide an electrical interconnect between semiconductor die 94 and the interconnect structure in the substrate. Solder bumps 102 bond to the contact pads on substrate 90 to provide an electrical interconnect between semiconductor die 96 and the interconnect structure in the substrate.

A molding compound or encapsulant 104 is deposited over substrate 90 and semiconductor die 92-96. Encapsulant 104 can be made with epoxy acrylate or other polymer material and applied by transfer molding, liquid encapsulant molding, or other molding process. The encapsulant is non-conductive and environmentally protects the semiconductor device from external elements and contaminants.

Figure 3B:
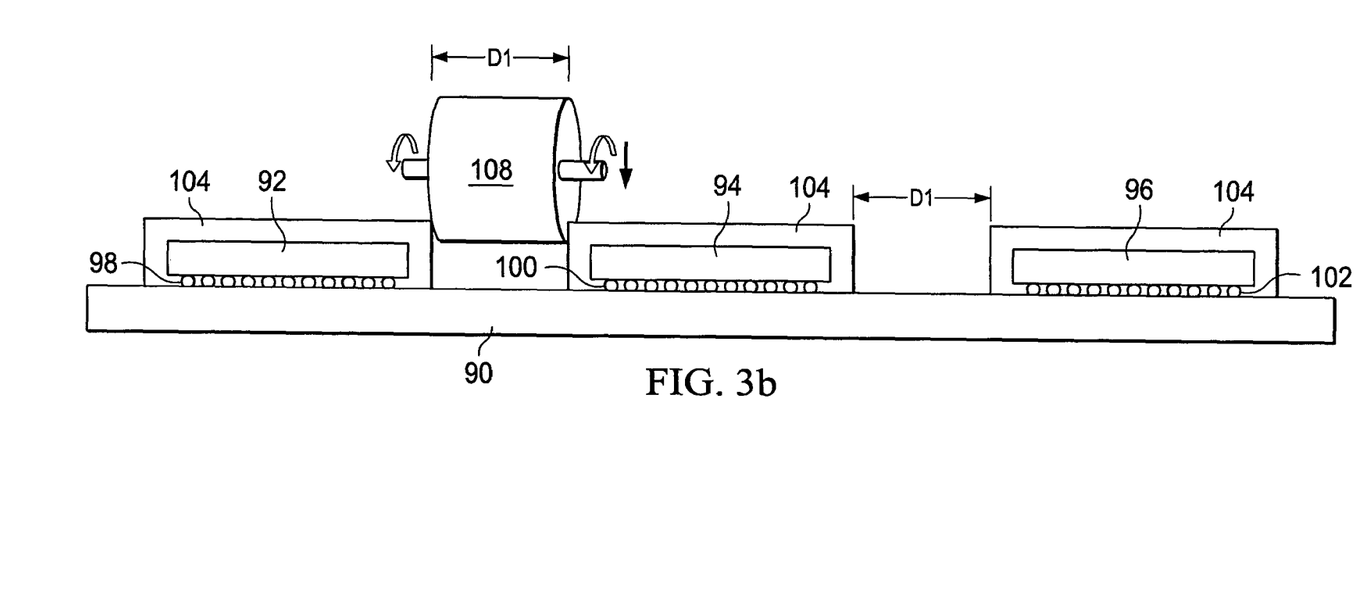
Figure 3C:
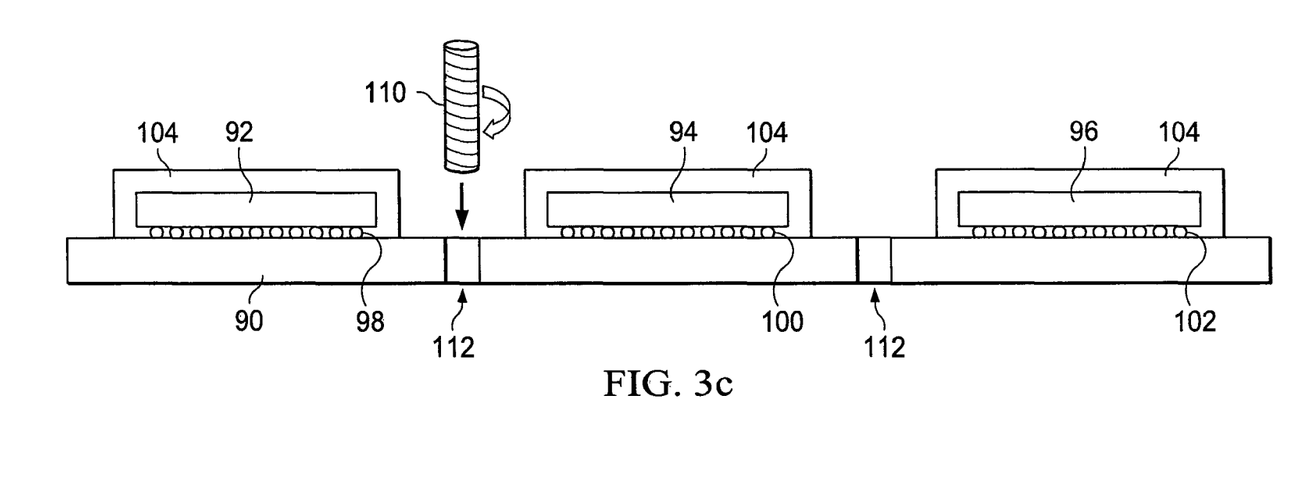

In FIG. 3b, a cutting blade 108 removes a portion of encapsulant 104 between semiconductor die 92 and 94, and between semiconductor die 94 and 96 in a partial dicing step. The cutting blade 108 cuts a dicing channel of width D1 in a peripheral region around the semiconductor die, down to substrate 90. The partial dicing step cuts into encapsulant 104 to provide a drilling area on substrate 90. Semiconductor die 92-96 remain enclosed by encapsulant 104. In FIG. 3c, a drill 110 forms openings or holes 112 through substrate 90. One or more holes 112 are formed in a peripheral region on each side of semiconductor die 92-96.

Figure 3D:
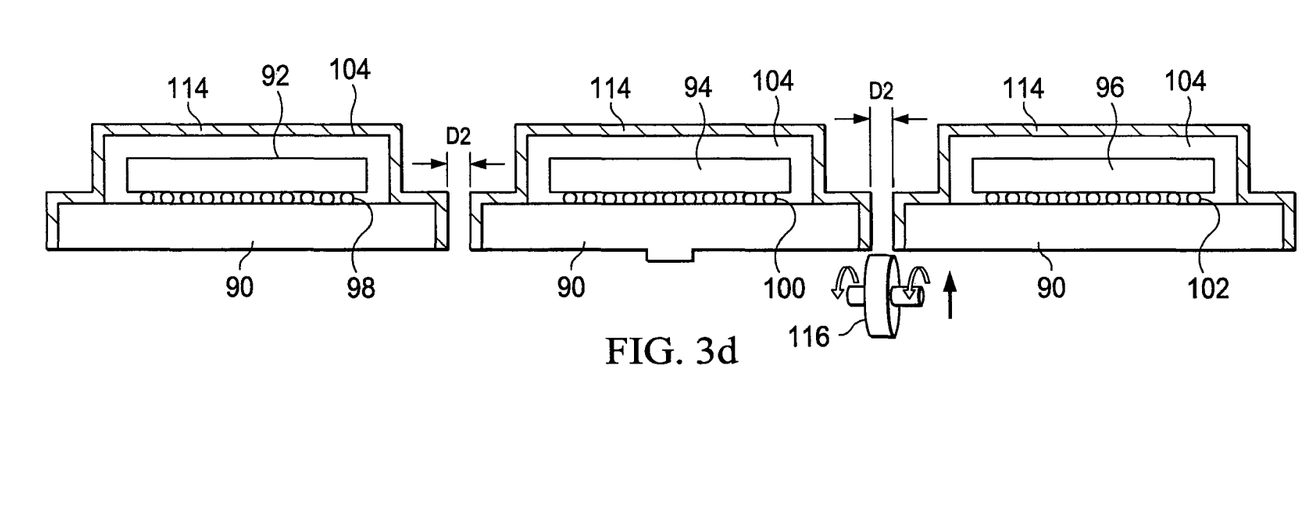

In FIG. 3d, a top or overlying shielding layer 114 is formed over all sides of encapsulant 104 using electrolytic plating, electroless plating, or other suitable metal deposition process. Shielding layer 114 is made with copper, aluminum, stainless steel, nickel silver, low-carbon steel, silicon-iron steel, and other metals and composites capable of blocking EMI, RFI, or other inter-device interference. Alternatively, shielding layer 114 contains conductive epoxy, laminate, or conductive plastics. Accordingly, shielding material 114 substantially covers the semiconductor die to inhibit EMI, RFI, and other inter-device interference from adversely influencing adjacent circuits. Shielding layer 114 is also deposited into holes 112. Shielding layer 114 does not fill a center area of holes 112 but rather forms a lining around a perimeter of the opening for the length of the hole. A cutting blade 116 singulates the semiconductor die 92-96 through holes 112, using a cutting width D2 to separate the shielded semiconductor devices. The cutting width D2 is less than the cutting width D1.

Figure 4:
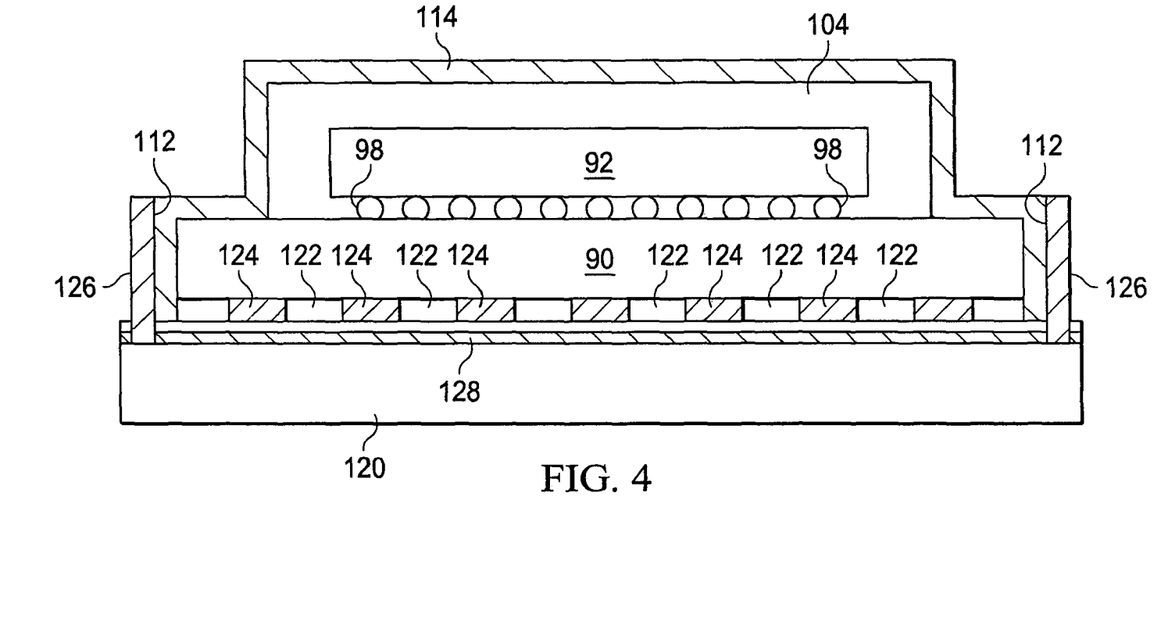
FIG. 4 illustrates the shielding layer with electrical connection through metal pillars formed in a dicing channel around the semiconductor die to a ground plane.

FIG. 4 shows semiconductor die 92 electrically connected to substrate 90 using solder bumps 98. Shielding layer 114 overlies encapsulant 104 and blocks EMI, RFI, and other inter-device interference. Substrate 90 is mounted to substrate or printed circuit board (PCB) 120. An interconnect structure 124 provides electrical connection between semiconductor die 92, substrate 90, and PCB 120. Substrate 90 has an interconnect structure to electrically connect semiconductor die 92 to PCB 120. The individual contacts of interconnect structure 124 are separated by insulating material 122. A conductive material is deposited into shielding-lined holes 112 to form metal ground pillars 126 which extend into PCB 120. The conductive material for pillars 126 can be Al, Cu, Sn, Ni, Au, or Ag deposited by a PVD, CVD, electrolytic plating, or electroless plating process. Metal pillars 126 electrically connect to ground conduction channel or ground plane 128 which is part of the interconnect structure in PCB 120. Ground plane 128 is disposed over, under, or embedded within layers of PCB 120 and extends from under the semiconductor die into the dicing channel between the semiconductor die. Ground plane 128 can be Al, Cu, Sn, Ni, Au, or Ag. In other embodiments, ground plane 128 contains stainless steel, nickel silver, low-carbon steel, silicon-iron steel, and other metals. Ground plane 128 is electrically connected to an external low-impedance ground point to aid in the shielding feature. Accordingly, the ground conduction path for shielding layer 114 includes the shielding layer lining of holes 112, metal pillars 126, and ground plane 128 of PCB 120.

Semiconductor die 92-96 may contain baseband circuits that are susceptible to EMI or RFI generated by other devices. In other embodiments, semiconductor die 92-96 contain integrated passive devices (IPD) that generate EMI or RFI. A typical RF system requires multiple IPDs and other high frequency circuits in one or more semiconductor packages to perform the necessary electrical functions. For example, the IPDs contained within semiconductor die 92-96 provide the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. Two or more baluns are used in a quad-band for mobile phones or other global system for mobile (GSM) communications, each balun dedicated for a frequency band of operation of the quad-band device.

These high frequency electrical devices generate undesired EMI, RFI, or other inter-device interference, such as capacitive, inductive, or conductive coupling, also known as cross-talk, which can interfere with the operation of adjacent or nearby circuit elements. For example, the output signal in the transmitter section of the radio frequency integrated circuit (RFIC) may interfere with the local oscillator (LO). The inductor can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and cross-talk to the received signal.

Shielding layer 114 completely covers all areas of encapsulant 104 relative to the top and sides of the semiconductor die. Shielding layer 114 is grounded through metal pillars 126 to ground plane 128 of PCB 120 to provide isolation for the enclosed semiconductor devices with respect to EMI, RFI, or other inter-device interference. The novel top shielding layer interconnected by metal pillars 126 along a dicing channel between the semiconductor die allows for thinner packages. Ground plane 128 is disposed in PCB 120 so it does not impact the structural integrity of substrate 90.

Figure 5:
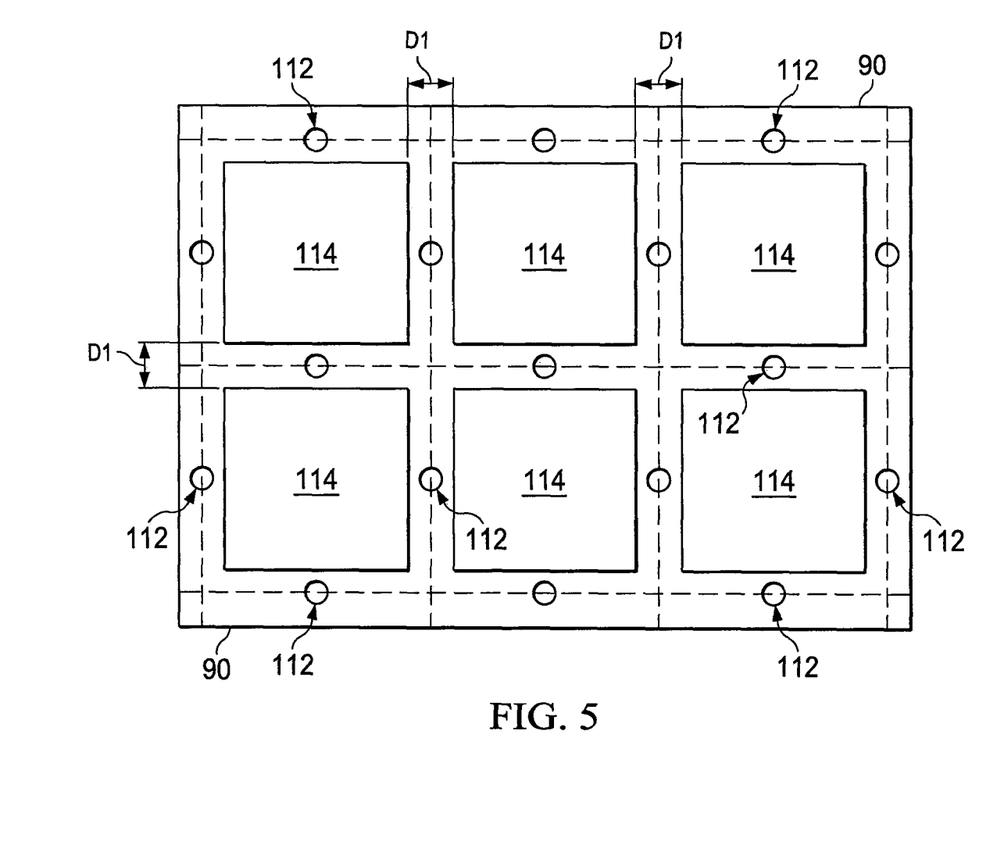
FIG. 5 illustrates a top view of the shielding layer with holes formed in a dicing channel around the semiconductor die.
Figure 6:
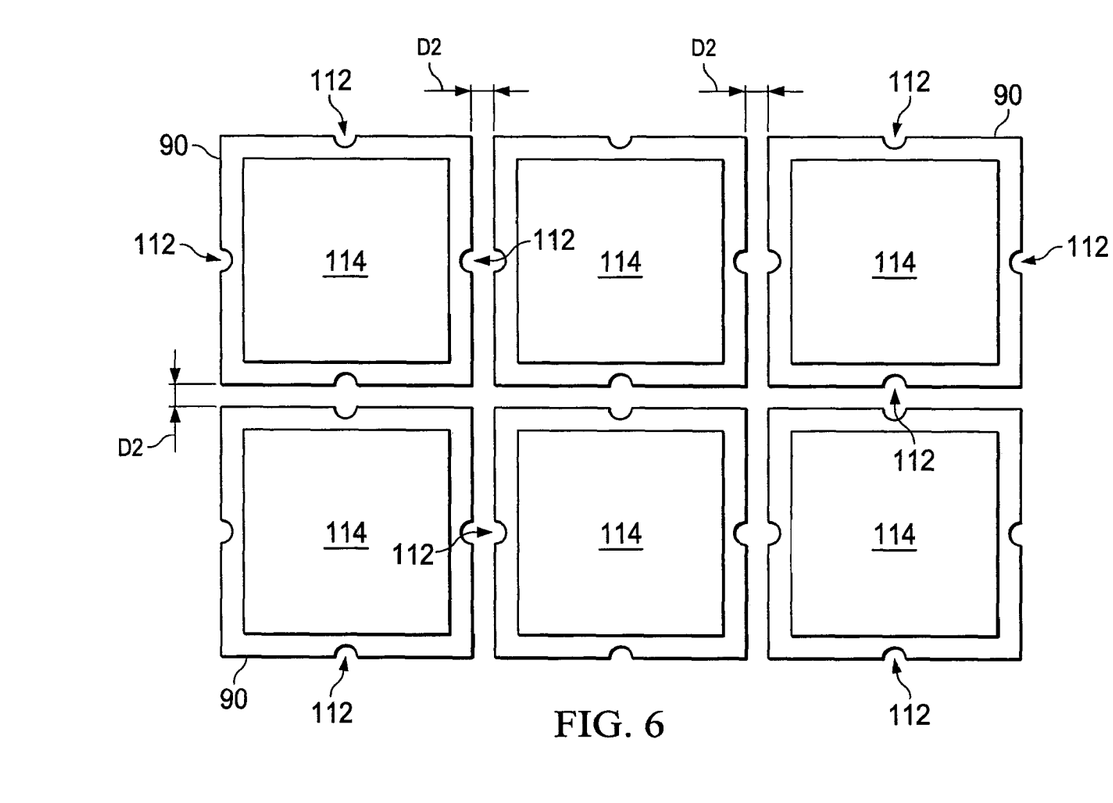
FIG. 6 illustrates a top view of the shielding layer singulated through the holes formed in a dicing channel around the semiconductor die.

FIG. 5 illustrates a top view of substrate 90 with shielding layers 114 enclosing the underlying semiconductor die. The dicing step removes encapsulant 104 to provide a dicing channel of width D1. The shielding-lined holes 112 are formed in the dicing channel. The singulation D2 in FIG. 6 through the dicing channel and holes 112 separates the top shielding layer and underlying semiconductor die into individual shielded semiconductor devices.

Figure 7:
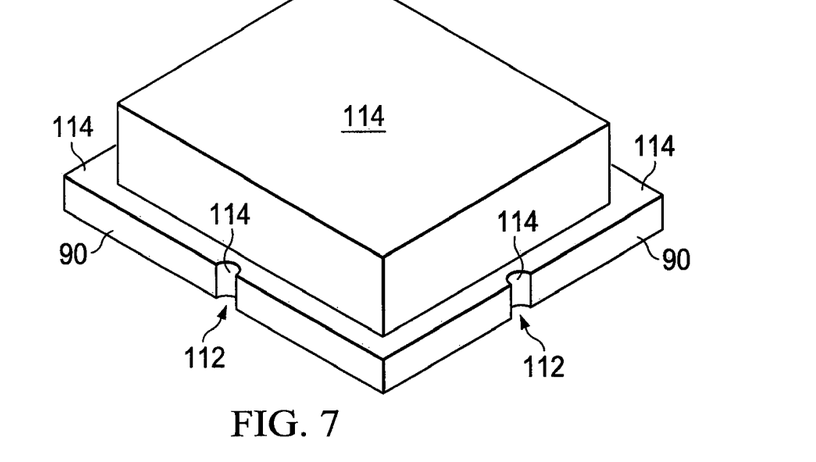
FIG. 7 illustrates a perspective view of the shielding layer with holes formed in a dicing channel around the semiconductor die.
Figure 8:
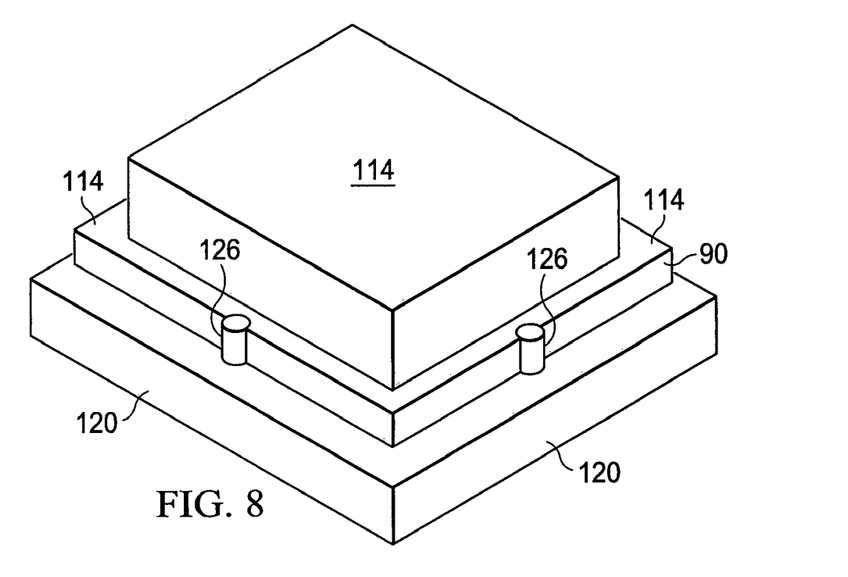
FIG. 8 illustrates a perspective view of the shielding layer with metal pillars formed in the holes.

FIG. 7 is a perspective view of a shielded semiconductor device with top shielding layer 114 and holes 112 lined with the shielding layer. Metal pillars 126 formed in shielding lined holes 112 as shown in FIG. 8 connect top shielding layer 114 to a ground plane embedded in PCB 120, similar to FIG. 4.

Figure 9:
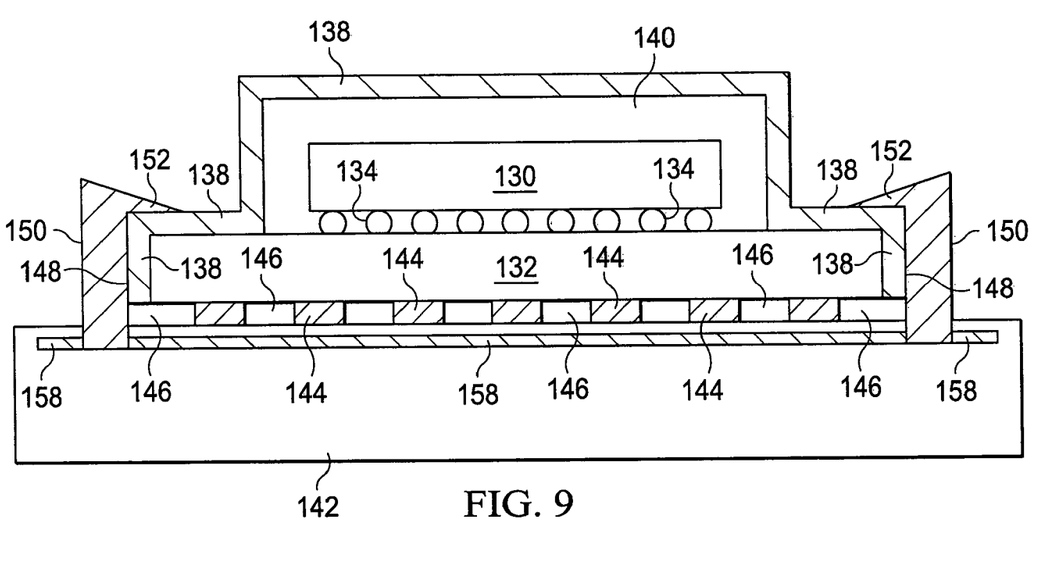
FIG. 9 illustrates the shielding layer with electrical connection through hooked metal pillars to a ground plane in the PCB.

FIG. 9 shows an alternate embodiment of the ground connection for the top shielding layer. Semiconductor die 130 is electrically connected to substrate 132 using solder bumps 134. Shielding layer 138 overlies encapsulant 140 and blocks EMI, RFI, and other inter-device interference. Substrate 132 is mounted to PCB 142. An interconnect structure 144 provides electrical connection between semiconductor die 130, substrate 132, and PCB 142. The individual contacts of interconnect structure 144 are separated by insulating material 146. Substrate 132 has an interconnect structure to electrically connect semiconductor die 130 to PCB 142. A conductive material is deposited into shielding-lined holes 148 to form metal ground pillars 150 which extend into PCB 142. The conductive material for pillars 150 can be Al, Cu, Sn, Ni, Au, or Ag deposited by a PVD, CVD, electrolytic plating, or electroless plating process. Metal pillars 150 are configured with hooks 152 which extend over an edge of shielding layer 138 for a mechanically secure connection. Hooks 152 lock shielding layer 138 into place to avoid potential electrical failure due to loss of mechanical contact. Metal pillars 150 electrically connect to ground plane 158 which is part of the interconnect structure in PCB 142. Accordingly, the ground conduction path for shielding layer 138 includes the shielding layer lining of holes 148, metal pillars 150, and ground plane 158 of PCB 142.

Figure 10:
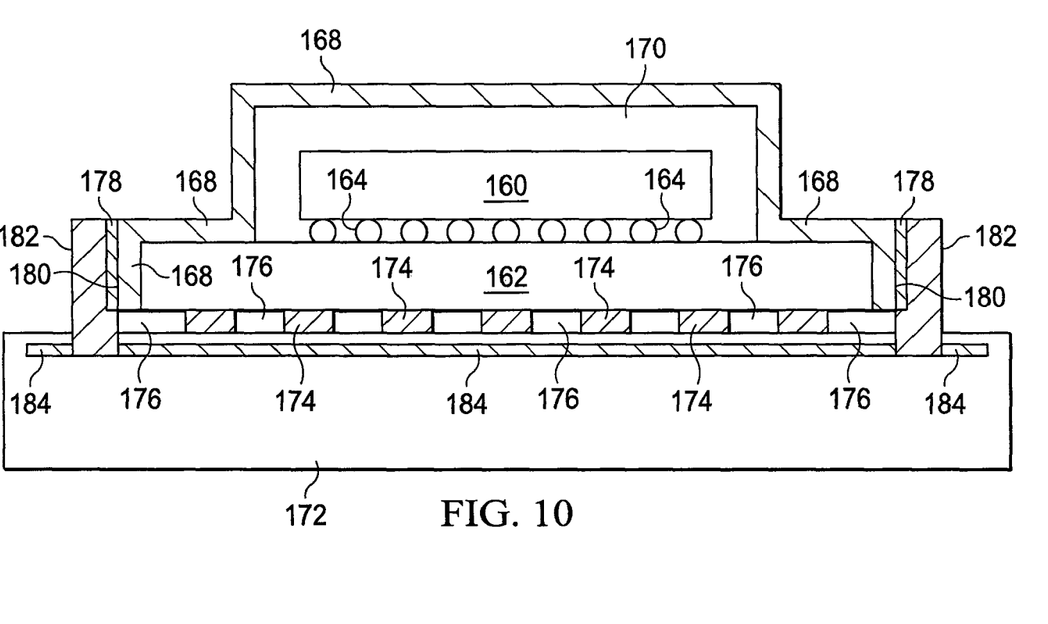
FIG. 10 illustrates the shielding layer with electrical connection through metal pillars formed in holes lined with solder material to a ground plane in the PCB.

FIG. 10 shows another embodiment of the ground connection for the top shielding layer. Semiconductor die 160 is electrically connected to substrate 162 using solder bumps 164. Shielding layer 168 overlies encapsulant 170 and blocks EMI, RFI, and other inter-device interference. Substrate 162 is mounted to PCB 172. An interconnect structure 174 provides electrical connection between semiconductor die 160, substrate 162, and PCB 172. The individual contacts of interconnect structure 174 are separated by insulating material 176. Substrate 162 has an interconnect structure to electrically connect semiconductor die 160 to PCB 172. The holes 178 are lined with shielding layer 168. A solder material 180 is deposited over the shielding layer lining. A conductive material is deposited into a remaining open portion of holes 178 to form metal ground pillars 182 which extend into PCB 172. Alternately, metal pillars 182 are coated with solder material 180. The conductive material for pillars 182 can be Al, Cu, Sn, Ni, Au, or Ag deposited by a PVD, CVD, electrolytic plating, or electroless plating process. Solder material 180 is reflowed to enhance the electrical contact between shielding layer 168 and metal pillars 182. Metal pillars 182 electrically connect to ground plane 184 which is part of the interconnect structure in PCB 172. Accordingly, the ground conduction path for shielding layer 168 includes the shielding layer lining of holes 178, solder material 180, metal pillars 182, and ground plane 184 of PCB 172.

In summary, the semiconductor devices are substantially enclosed by a shielding layer using a simple manufacturing process. Semiconductor die are mounted to the substrate. A top shielding layer is disposed over the semiconductor die. A hole is drilled through the semiconductor substrate along a dicing channel between the semiconductor die. The hole is lined with the shielding layer. A metal ground pillar is formed in the remaining open portion of the shielding lined hole and electrically connected to a ground plane in the PCB. The shielding layer isolates each circuit element from cross-talk generated by adjacent circuit elements. The cross-talk may be in the form of conductive coupling, inductive coupling, magnetic field coupling, electric field coupling, or capacitive coupling depending on the electrical nature of the adjacent device.

The shielded semiconductor device avoids any additional conductive elements in the substrate. In addition, by making electrical connection from the shielding layer to the PCB ground plane using shielding layer lined holes in the saw lines of the substrate, the substrate can be made thinner as there is no need to alter the circuit design of substrate, nor embed a ground plane in the substrate as found in the prior art. The ground plane is disposed in the PCB so it does not impact the structural integrity of the semiconductor substrate.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a shielded semiconductor device, comprising:
    providing a first substrate, the first substrate including multiple laminated layers;
    mounting a plurality of semiconductor die to the first substrate;
    forming an encapsulant over the semiconductor die and first substrate;
    forming a dicing channel through the encapsulant between the semiconductor die to expose a flat upper surface of the first substrate, the dicing channel having substantially vertical sidewalls;
    forming a circular opening through the first substrate and in a region of the flat upper surface that is exposed by the dicing channel;
    forming a shielding layer over the encapsulant and in the circular opening, the shielding layer covering sidewalls of the circular opening along an entire length of the circular opening;
    singulating the first substrate to separate the semiconductor die;
    mounting the first substrate to a second substrate; and
    forming a metal pillar in the opening to electrically connect the shielding layer to a ground plane disposed in the second substrate.

2. The method of claim 1, further including forming an interconnect structure on the first substrate to electrically connect the semiconductor die to the second substrate.

3. The method of claim 1, wherein the metal pillar includes a hook to make a mechanically secure connection to the shielding layer.

4. The method of claim 1, further including depositing solder material between the shielding material lining the circular opening and the metal pillar.

5. The method of claim 1, wherein the circular opening through the first substrate and another circular opening through the first substrate are formed on each side of the semiconductor die.

6. The method of claim 1, further including drilling a hole in the first substrate to form the circular opening.

7. The method of claim 1, wherein the shielding layer blocks inter-device interference from the semiconductor die.

8. A method of making a semiconductor device, comprising:
    providing a first substrate;
    mounting a semiconductor die to the first substrate;
    forming an encapsulant over the semiconductor die and first substrate;
    forming a dicing channel through the encapsulant in a peripheral region around the semiconductor die to expose a flat upper surface of the first substrate;
    forming an opening through the first substrate in a region of the flat upper surface that is exposed by the dicing channel, wherein a perimeter of the opening in a plane of the flat upper surface describes a closed figure;
    forming a shielding layer over the encapsulant and in the opening, the shielding layer covering sidewalls of the opening;
    mounting the first substrate to a second substrate; and
    forming a metal pillar in the opening that electrically connects the shielding layer to a ground plane in the second substrate.

9. The method of claim 8, further including forming an interconnect structure on the first substrate to electrically connect the semiconductor die to the second substrate.

10. The method of claim 8, wherein the metal pillar includes a hook to make a mechanically secure connection to the shielding layer.

11. The method of claim 8, further including depositing solder material between the shielding material lining the opening and metal pillar.

12. The method of claim 8, wherein the openings in the first substrate are formed in a peripheral region on each side of the semiconductor die.

13. The method of claim 8, further including drilling a hole in the first substrate to form the opening.

14. A method of making a semiconductor device, comprising:
    providing a substrate;
    after providing the substrate, mounting a semiconductor die to the substrate;
    forming an encapsulant over the semiconductor die and substrate;
    forming a dicing channel through the encapsulant in a peripheral region around the semiconductor die to expose an upper surface of the substrate;
    forming a shielding layer over the encapsulant; and
    forming a metal pillar through a thickness of the shielding layer and through a thickness of the substrate in the peripheral region around the semiconductor die to electrically connect the shielding layer to a ground point.

15. The method of claim 14, further including:
forming an opening in the substrate along the dicing channel;
lining the opening with the shielding layer; and
forming the metal pillar in the opening.

16. The method of claim 15, further including depositing solder material between the shielding material lining the opening and metal pillar.

17. The method of claim 15, wherein the openings in the substrate are formed on each side of the semiconductor die.

18. The method of claim 14, wherein the metal pillar includes a hook to make a mechanically secure connection to the shielding layer.

19. The method of claim 14, wherein the shielding layer blocks inter-device interference from the semiconductor die.

20. The method of claim 14, wherein the shielding layer is selected from the group consisting of copper, aluminum, stainless steel, nickel silver, low-carbon steel, and silicon-iron steel.

21. The semiconductor device of claim 20, wherein the metal pillars include a hook to make a mechanically secure connection to the shielding layer.

22. The semiconductor device of claim 20, wherein the metal pillars are formed in a peripheral region on each side of the semiconductor die.

23. The semiconductor device of claim 20, wherein the shielding layer blocks inter-device interference from the semiconductor die.

24. A semiconductor device, comprising:
a substrate;
a semiconductor die mounted to the substrate;
a molding compound formed over the semiconductor die and the substrate;
a shielding layer formed over the molding compound and the semiconductor die, the shielding layer contacting a sidewall of the substrate along an entire length of the sidewall; and
metal pillars formed through the shielding layer and substrate in a peripheral region around the semiconductor die to electrically connect the shielding layer to a ground point.

* * * * *